(12) United States Patent
Hayashi et al.

(10) Patent No.: US 9,117,987 B2
(45) Date of Patent: Aug. 25, 2015

(54) LIGHT EMITTING DEVICE AND METHOD FOR MANUFACTURING LIGHT EMITTING DEVICE

(71) Applicant: NICHIA CORPORATION, Anan-shi, Tokushima (JP)

(72) Inventors: Tadao Hayashi, Tokushima (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/445,165

(22) Filed: Jul. 29, 2014

(65) Prior Publication Data

US 2015/0034987 A1 Feb. 5, 2015

(30) Foreign Application Priority Data

Jul. 30, 2013 (JP) ................. 2013-157729

(51) Int. Cl.
*H01L 33/00* (2010.01)
*H01L 33/60* (2010.01)
*H01L 33/50* (2010.01)

(52) U.S. Cl.
CPC ............... *H01L 33/60* (2013.01); *H01L 33/50* (2013.01)

(58) Field of Classification Search
None
See application file for complete search history.

(56) References Cited

U.S. PATENT DOCUMENTS

| | | | | |
|---|---|---|---|---|
| 7,910,938 | B2* | 3/2011 | Hussell et al. | 257/98 |
| 8,294,165 | B2* | 10/2012 | Hattori et al. | 257/98 |
| 8,324,797 | B2* | 12/2012 | Shylo et al. | 313/503 |
| 2006/0193121 | A1 | 8/2006 | Kamoshita | |
| 2011/0006334 | A1* | 1/2011 | Ishii et al. | 257/98 |
| 2012/0132944 | A1* | 5/2012 | Hsieh et al. | 257/98 |
| 2012/0267659 | A1* | 10/2012 | Chou et al. | 257/98 |

FOREIGN PATENT DOCUMENTS

| | | |
|---|---|---|
| JP | 2001-196640 A | 7/2001 |
| JP | 2006-245020 A | 9/2006 |
| JP | 2007-005522 A | 1/2007 |
| JP | 2007-059612 A | 3/2007 |
| JP | 2011-082590 A | 4/2011 |

* cited by examiner

*Primary Examiner* — Bilkis Jahan
(74) *Attorney, Agent, or Firm* — Global IP Counselors, LLP

(57) ABSTRACT

A semiconductor device includes a substrate; a light emitting element flip-chip mounted on the substrate; a phosphor-containing member provided at least above the light emitting element and separated from the light emitting element; and a first reflecting member configured to cover the phosphor-containing member, at least one of a side faces of the light emitting device having an opening for extracting light emitted from the light emitting element and light wavelength-converted by the phosphor-containing member.

16 Claims, 10 Drawing Sheets

LIGHT EMITTING DEVICE AND METHOD FOR MANUFACTURING LIGHT EMITTING DEVICE

CROSS-REFERENCE TO RELATED APPLICATIONS

This application claims priority to Japanese Patent Application No. 2013-157729 filed on Jul. 30, 2013. The entire disclosure of Japanese Patent Application No. 2013-157729 is hereby incorporated herein by reference.

BACKGROUND

1. Technical Field

The present disclosure relates to a light emitting device and a method for manufacturing a light emitting device.

2. Related Art

Light emitting diodes (LEDs) and other such semiconductor light emitting elements are compact, have good power efficiency, emit light in vivid color, do not burn out, because they are semiconductor elements, have excellent initial drive characteristics, and are resistant to vibrations and being repeatedly switched on and off.

Because of these outstanding features, light emitting devices in which semiconductor light emitting elements are installed as a light source are utilized, in various structures adapted to the application, as light sources for ordinary consumer products, such as lighting devices and backlights for liquid crystal displays (LCDs).

Usually, a light emitting device in which a semiconductor light emitting element is used as a light source is similar to an ordinary semiconductor element in that it is manufactured by installing a semiconductor light emitting element (hereinafter referred to simply as a "light emitting element") on a substrate provided with wiring for supplying drive current to the light emitting device, electrically connecting the light emitting element to this wiring, and sealing the element with a resin.

This resin can be made from a light-transmissive material so as to transmit the light emitted by the light emitting element.

Furthermore, there are known light emitting devices in which a phosphor is contained in this transmissive resin (sealing member), so as to emit light with not just the color of light emitted by the light emitting element, but also mixed colors of the color of light emitted by the light emitting element and the color of light that has undergone wavelength conversion by the phosphor.

For example, JP2001-196640A discloses a manufacturing method of a light emitting device that includes affixing a prepared reflector having a cavity with an opening for resin injection to a wiring board with a light emitting element mounted thereon, filling the cavity of a reflector with a transmissive resin through the opening and hardening the resin. In the reflector, the cavity covers the light emitting element so that a light from the light emitting element is reflected on the inner wall faces of the cavity.

Also, JP2006-245020A discloses a light emitting device in which an LED chip, a phosphorescent substance that emits light of a different wavelength from that of the light emitted by the LED chip and that is excited by the light from the LED chip, and a light-transmissive resin that supports the phosphorescent substance inside a package. The LED chip is an LED element that has side face portions and a top face portion, and the side face portions have sloped faces that are inclined in a convex shape toward the opening in the package. The phosphorescent substance is preferably disposed in the form of a layer over the bottom face of the package so as to cover all or part of the side face part of the LED chip.

SUMMARY

The present disclosure relates to a light emitting device. The light emitting device includes
 a substrate;
 a light emitting element flip-chip mounted on the substrate;
 a phosphor-containing member provided at least above the light emitting element and separated from the light emitting element;
 a first reflecting member configured to cover the phosphor-containing member, and
 an opening in at least one of side faces of the light emitting device, the opening extracting light emitted from the light emitting element and light whose wavelength is converted by the phosphor-containing member.

Further, the present disclosure relates to a method for manufacturing a light emitting device includes;
 mounting a light emitting element onto a substrate in a flip-chip manner,
 forming a phosphor-containing member at least above the light emitting element, the phosphor-containing member being separate from the light emitting element,
 forming a first reflecting member that is configured to covers the phosphor-containing member, and
 forming, on at least one side face of the light emitting device, an opening for extracting light whose wavelength is converted by the phosphor-containing member and light emitted from the light emitting element.

DETAILED DESCRIPTION

With the semiconductor device and a method for manufacturing the semiconductor device by the present disclosure, a slimmer product can be obtained because the light emitting element is flip-chip mounted.

Furthermore, since the opening is on a side face, even with a narrow opening, the light output can be increased by increasing the width of the light emitting element.

Embodiments of the present invention will now be described through reference to the drawings.

Embodiment 1
Structure of Light Emitting Device

First, the structure of the light emitting device pertaining to Embodiment 1 will be described.

Figure 1:
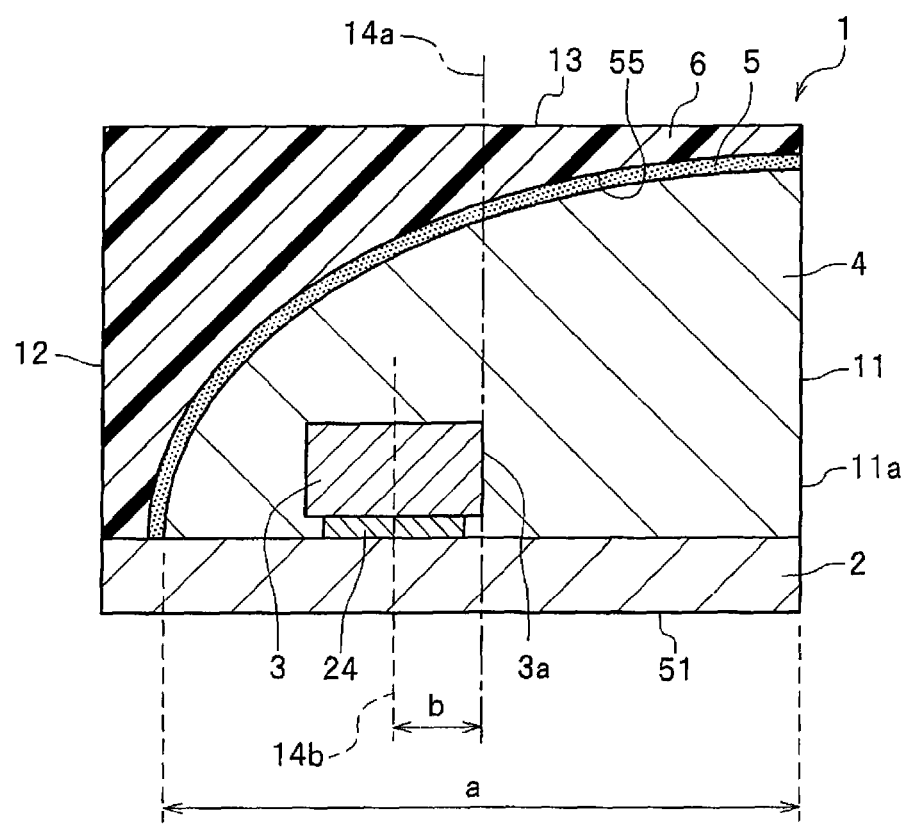
FIG. 1 is an enlarged vertical cross section of the light emitting device according to Embodiment 1 of the invention.
Figure 2:
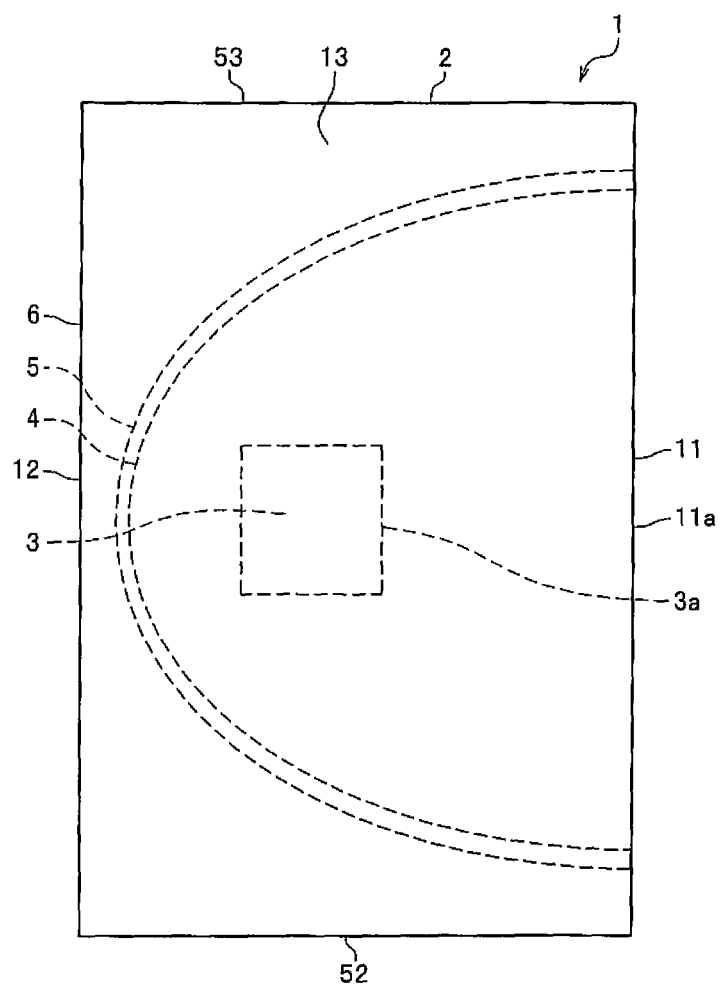
FIG. 2 is an enlarged plan view of the light emitting device according to Embodiment 1 of the invention.

As shown in FIGS. 1 and 2, the light emitting device 1 in this embodiment has a cuboid external shape, and has a bottom face 51 and four side faces 11, 12, 52, and 53. The light emitting device 1 comprises a substrate 2 that serves as the bottom face 51, and a light emitting element 3 mounted on the substrate 2.

Various kinds of material can be used for the substrate 2, as long as the substrate 2 has wiring connected to the light emitting element 3.

For example, insulating support substrate such as ceramic (such as Al2O3, AlN) or the like with wiring thereon, or a substrate having resin (such as phenolic resin, epoxy resin, polyimide resin, BT resin (bismaleimide triazine resin), polyphthalamide (PPA)) and a lead frame can be used.

The lead frame here comprises a positive lead electrode and a negative lead electrode.

These electrodes are joined to a p side pad electrode 38p and an n side pad electrode 38n (see FIG. 3) of the light emitting element 3 at the upper face of the substrate 2, via a bonding member 24 (discussed below), and serve as terminals that are connected to an external power supply of the light emitting device 1 at the lower face (rear face) of the substrate 2.

The substrate 2 may be one that include wiring without a support substrate.

This affords a slimmer light emitting device.

Also, to increase efficiency, both the wiring and the insulating portion of the substrate 2 preferably have high light reflectivity.

The surface of the wiring portion of the substrate 2 can be made from silver, gold, rhodium, platinum, or another such material, but silver is particularly favorable from the standpoint of light reflectivity.

A material with high gloss is even better.

The substrate 2 and the light emitting element 3 are covered with a light-transmissive member 4 that is formed from a transparent resin or the like and contains substantially no phosphor.

The light-transmissive member 4 may include a diffusing agent or the like, but preferably does not.

The light-transmissive member 4 is formed directly over the light emitting element 3, and a phosphor layer 5 that serves as a phosphor-containing member is formed over this.

In this embodiment, the phosphor layer 5 serving as the phosphor-containing member is formed as a layer over the light-transmissive member 4, but the phosphor-containing member can be configured in a variety of other shapes besides that of a layer.

Since the light-transmissive member 4 is thus formed over the light emitting element 3, the phosphor layer 5 is provided at least above the light emitting element 3 and separated from the light emitting element 3.

A reflecting layer 6 that is made of a reflective resin and that serves as the first reflecting member is provided above the phosphor layer 5.

A variety of materials can be used for the light-transmissive member 4, but after taking light-transmissiveness, reliability, mass production, and so forth into account, a resin material such as a dimethyl silicone resin, a phenyl silicone resin, a dimethyl/phenyl hybrid silicone resin, an epoxy/silicone hybrid resin, a fluorocarbon resin, an adamantane resin, an alicyclic epoxy resin, a hybrid epoxy resin, an urethane resin, polycarbonate (PC), a polymethyl methacrylate (PMMA) can be used, for example.

A silicone resin is particularly preferable because of its good resistance to heat and light and high optical transmissivity.

The light-transmissive member 4 may contain silica or another such filler, or its surface may be textured.

The phosphor-containing member is a member that contains a phosphor that absorbs part of the light with the wavelength emitted by the light emitting element 3, converts this into light of a different wavelength, and emits the resulting light.

In this embodiment, the phosphor-containing member is the phosphor layer 5.

The phosphor layer 5 is produced by adding a phosphor to a resin that serves as a binder.

In addition to a phosphor, the layer may also contain a diffusing agent.

The phosphor layer 5 may have a single-layer structure, or it may have a multilayer structure, or may have a multilayer structure in which each of the plurality of layers contains different types of phosphor.

As phosphor contained in the phosphor layer, a phosphor based on a yttrium aluminum oxide phosphor activated with Ce (cerium):called YAG phosphor, which can be excited to emit light by light emitted from a light emitting element 3 having an active layer of a nitride semiconductor can be used.

Specific yttrium aluminum oxide phosphor includes Y3Al5O12Y: Ce (YAG:Ce).

At least one of Ba, Sr, Mg, Ca, and Zn can be contained in the yttrium aluminum oxide phosphor.

In the case where silicon is added to the YAG contained in the phosphor layer 5, this will suppress crystal growth reactions and result in more orderly phosphor particles.

Also, when a YAG-based phosphor that is excited by blue light and emits green to yellow light is used together with a nitrogen-containing Ca—Al—Si—O—N-based phosphor (oxynitride phosphor) that is excited by blue light and emits orange to red light, then a light emitting element 3 capable of emitting blue light can be utilized to obtain a white light emitting diode with a good color rendering property.

Also, a light emitting device 1 that emits the desired intermediate color can be obtained by adding the desired pigment.

A diffusing agent can be added to efficiently diffuse the light emitted by the phosphor and/or the semiconductor light emitting element 3.

Specific examples of material using the diffusing agent include titanium oxide, silicon oxide, hollow silicon oxide, aluminum oxide, potassium titanate, zinc oxide, boron nitride.

A silicone or other such resin powder may be used.

The average particle size of the diffusing agent can be from 0.001 to 100 μm, for example, and preferably 0.005 to 50 μm.

A binder is a member used for binding the above-mentioned phosphor or diffusing agent to the reflecting layer 6 or the light-transmissive member 4 as the phosphor layer 5.

There are no particular restrictions on the material of this binder, which can be a resin, an inorganic material, or the like.

In the case where a resin is used, a thermosetting resin with excellent light-transmittance is preferable.

The resin material such as a dimethyl-based silicone resin, a phenyl-based silicone resin, a dimethyl/phenyl hybrid silicone resin, an epoxy/silicone hybrid resin, a fluorocarbon resin, an adamantane resin, an alicyclic epoxy resin, a hybrid epoxy resin, an urethane resin, can be used, for example.

A silicone resin with good resistance to heat and light and high optical transmissivity is particularly preferable.

A glass component may be added to the binder to raise its hardness.

Also, an adhesion-imparting agent may be added to improve adhesiveness.

Silane coupling agent, titanate coupling agent, aluminum coupling agent can be used as the adhesion-imparting agent, for example.

A light-transmissive inorganic material can also be used as a binder. At least one of a compound selected from a group comprising of $Al_2O_3$, $SiO_2$, $ZrO_2$, $HfO_2$, $TiO_2$, $ZnO$, $Ta_2O_5$, $Nb_2O_5$, $In_2O_3$, $SnO_2$, $TiN$, $AlN$ can be suitably used.

The phosphor layer 5 may be formed with a single layer, or may be formed with a plurality of layers.

Emission color can be easily adjusted by laminating the phosphor layer 5 as a plurality of layers.

The reflecting layer 6 is a member for reflecting light emitted by the light emitting element 3 to the phosphor layer 5 side or the opening 11a of the light emitting device 1.

A material with high light reflection is used for the reflecting layer 6.

For instance, it can be a resin layer containing a light reflecting material.

For example, the reflecting layer 6 can be one that includes the light reflecting material and a filler which can be added to the resin such as a silicone resin serving as the binder.

The binder is a member for binding the above-mentioned reflecting material or filler and fix on the phosphor layer 5, as the reflecting layer 6.

There are no particular restrictions on of the binder of the specific material, and a resin, an inorganic material, or the like can be used.

The resin serving as the binder can be the same as that used for the binder in the phosphor layer 5.

The reflecting material is a member that reflects the light emitted by the light emitting element 3.

The same material as that of the diffusing agent used for the phosphor layer 5 can be used as the reflecting material.

The filler is added for a variety of purposes, such as to raise the strength of the reflecting layer 6 (a resin layer), or to raise the thermal conductivity of the reflecting layer 6.

Glass fibers, whiskers, aluminum oxide, silicon oxide, boron nitride, zinc oxide, aluminum nitride can be used as the filler, for example.

As discussed above, the light emitting device 1 in this embodiment has a cuboid shape, and when the face on the substrate 2 side of the light emitting element 3 is define to be the bottom face 51, then at least one of the four side faces 11, 12, 52, and 53 (the side face 11 in this example) has the opening 11a.

That is, the light emitting device 1 in this embodiment is a side face emitting type of light emitting device that emits light from the opening 11a in the side face 11.

When the side face 11 having the opening 11a is at the front of the light emitting device 1, and the side face 12 is on the opposite side, then the phosphor layer 5 and the reflecting layer 6 are formed on the left and right sides (the side faces 52 and 53 sides), to the rear (the side face 12 side), and above (the upper face 13 side) of the light emitting element 3 (and of the light-transmissive member 4 surrounding it).

That is, the phosphor layer 5 in this embodiment surrounds the light emitting element 3.

With this light emitting device 1, light that is wavelength-converted by the phosphor layer 5 and light from the light emitting element 3 can be extracted from the opening 11a in the side face 11.

With the light emitting device 1 of the present embodiment, to mount the light emitting element 3 on the substrate 2, flip-chip mounting is performed in which the positive and negative electrodes are mounted opposite the substrate 2.

Figure 3:
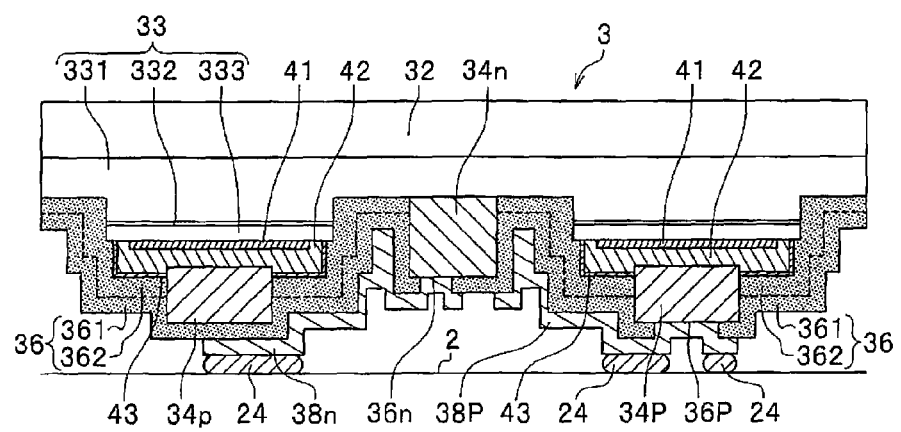
FIG. 3 is an enlarged vertical cross section of the light emitting element when it has been flip-chip mounted on the substrate, before the formation of the light-transmissive member, the phosphor layer, and the first reflecting member of the light emitting device according to Embodiment 1 of the invention.

FIG. 3 is a detail vertical cross section of the light emitting element 3 in this embodiment which is flip-chip mounted on the substrate 2, before the formation of the light-transmissive member 4, the phosphor layer 5, and the first reflecting member 6

As shown in FIG. 3, the light emitting element 3 is equipped with a substrate 32, a semiconductor laminate 33 that is laminated over the substrate 32, an n side electrode 34n, the n side pad electrode 38n, a p type overall electrode 41, a p type cover electrode 42, an insulating film 43, a p side electrode 34p, the p side pad electrode 38p, and an insulating film 36.

The n side electrode 34n and the p side electrode 34p are both provided on the same side where the semiconductor laminate 33 of the light emitting element 3 is provided, which is better suited to flip-chip mounting.

The semiconductor laminate 33 has a laminar structure in which an n type semiconductor layer 331 composed of a gallium nitride-based compound semiconductor, an active layer 332, and a p type semiconductor layer 333 are laminated in that order from the substrate 32 side, for example.

The substrate 32 of the light emitting element 3 may be formed from a substrate material that allows a nitride semiconductor to be epitaxially grown, but because flip-chip mounting is involved, the substrate is preferably light-transmissive so that light can be extracted.

Examples of the material for the substrate include an insulating substrate, such as sapphire ($Al_2O_3$) having a main surface of any one of C plane, R plane, A plane, M plane, spinel ($MgAl_2O_4$), and the like, and silicone carbide (SiC), ZnS, ZnO, Si, GaAs, diamond, and an oxide substrate such as lithium niobate and neodymium gallate which are capable of forming a lattice matching with the nitride semiconductor.

The p side pad electrode 38p and the n side pad electrode 38n are pad electrodes used for connection using the bonding member 24 (Au—Sn eutectic solder, etc.) or the like in the mounting of the light emitting element 3 to the substrate 2.

In this embodiment, the p side pad electrode 38p is electrically connected to the surface of the p side electrode 34p in an opening 36p of the insulating film 36, and is also provided so as to extend over a wide range on the insulating film 36.

The n side pad electrode 38n is electrically connected to the surface of the n side electrode 34n in an opening 36n of the insulating film 36, and is also provided so as to extend over the insulating film 36.

That is, the p side pad electrode 38p and the n side pad electrode 38n both extend over the insulating film 36, which is provided above the p type semiconductor layer 333.

Consequently, the surface area of the n side pad electrode 38n can be larger than that of the exposed part of the n type semiconductor layer 331, which improves enhance bonding property of the n side pad electrode 38n to the substrate 2.

Furthermore, in this embodiment, the p side pad electrode 38p and the n side pad electrode 38n have substantially the same height from the upper face of the substrate 32.

Therefore, the upper ends of the p side pad electrode 38p and the n side pad electrode 38n, which are the connected parts in flip-chip mounting, are at the same height, so there is no step between the p-side electrode connection face and the n-side electrode connection face, making mounting easier.

The p side pad electrode 38p and the n side pad electrode 38n are preferably metal films that have good adhesion to the p side electrode 34p and the n side electrode 34n to which they are provided, and that have low electrical resistance overall.

An example of a metal film that can be used is a multilayer film in which titanium, nickel, and gold are laminated in that order from the lower layer side.

When the p side pad electrode 38p and the n side pad electrode 38n extend over a wide area as in this embodiment, the heat dissipation of the light emitting element 3 can be improved.

The location and surface area over which the p side pad electrode 38p and the n side pad electrode 38n extend can be determined taking into account ease of mounting and heat dissipation.

The insulating film 36 is a film with an insulating property, which covers the exposed surface of the semiconductor laminate 33, and functions as an antistatic film and a protective film for the semiconductor laminate 33.

The material of the insulating film 36 can be an oxide of silicon, titanium, tantalum, niobium, or the like.

In this embodiment, the insulating film 36 is made up of two layers: a second insulating film 362 and a first insulating film 361 that is provided on the second insulating film 362 so as to cover the side faces and the upper faces of the p side electrode 34p and the n side electrode 34n except for at the openings 36p and 36n.

Accordingly, the insulating film 36 is formed thinner at the upper faces of the p side electrode 34p and the n side electrode 34n than in other areas.

The first insulating film 361 and the second insulating film 362 are both formed from the same material, and are substantially integrated films.

In FIG. 3, the light emitting element 3 is preferably joined on the substrate 2 using Au—Sn eutectic solder or another such solder (bonding member) 24.

Alternatively, a bump composed of gold or another such metal may be used as the bonding member 24 that joins the light emitting element 3 and the substrate 2 together. The space between the lower part of the light emitting element 3 and the substrate 2 is preferably filled with an insulating resin or another such underfill material in order to improve the joint strength.

With the light emitting device 1 in this embodiment, the light extraction face is a side face of the light emitting device 1, such as the side face 11.

The phosphor layer 5 is provided at least above the light emitting element 3, and separated from the light emitting element 3, and the top of the phosphor layer 5 is covered by the reflecting layer 6.

Also, with the light emitting device 1 in this embodiment, when the side face 11 on the opening 11a side is define to be the front and the side face 12 on the opposite side is the rear, the inner wall 55 of the reflecting layer 6 has a shape that continuously curves to the inside, so as to surround the rear (the side face 12 side), the top (the upper face 13 side), and the left and right sides (the side faces 52 and 53 sides) of the light emitting element 3.

Also, the light emitting element 3 is provided so that the center position of the light emitting element 3 (broken line 14b) in the longitudinal direction (the left and right direction in FIG. 1) is further to the rear (the left side in FIG. 1) by a distance b than the center position of the light-transmissive member 4 (the one-dot chain line 14a, which is the center portion of the distance a in FIG. 1) in the longitudinal direction (the left and right direction in FIG. 1).

Consequently, the light emitting element 3 is provided behind the opening 11a, so there will be less light that undergoes multiple reflection in the opposite direction from the opening 11a, and this can improve the light extraction efficiency of the light emitting device 1.

Method for Manufacturing Light Emitting Device

Next, the method for manufacturing the light emitting device 1 will be described based on the Figures.

FIGS. 4A to 4D are diagrams illustrating the steps in a method for manufacturing the light emitting device 1 according to Embodiment 1 of the invention.

Figure 5:
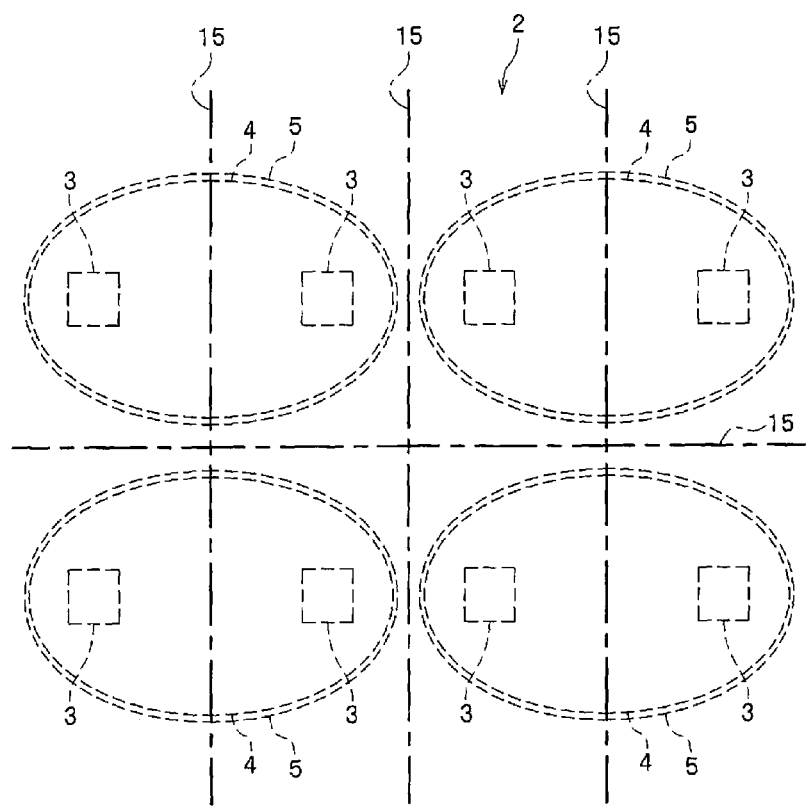
FIG. 5 is an enlarged plan view of when numerous light emitting devices according to Embodiment 1 of the invention have been formed on an aggregate substrate.

FIG. 5 is a detail plan view of when numerous light emitting devices 1 have been formed on an aggregate substrate 2.

First Step

Figure 4A:
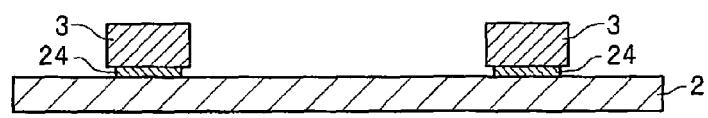
FIG. 4a is a diagram illustrating the step in a method for manufacturing the light emitting device according to Embodiment 1 of the invention.

As shown in FIG. 4A, first, the light emitting elements 3, which are blue LED chip comprising a light-transmissive sapphire substrate and nitride semiconductor layers, are die-bonded to the substrate 2 that prepared as an aggregate substrate by flip-chip mounting as discussed above.

In this embodiment, as shown in FIGS. 4a to 4d and 5, a plurality of light emitting elements 3 are mounted in a matrix, separated from one another, on the substrate 2.

Each light emitting element 3 is mounted so that the center position (the broken line 14b in FIG. 1) of the light emitting element 3 in the longitudinal direction of the substrate 2 will be further to the rear than the center of the substrate 2 in the longitudinal direction (the one-dot chain line 14a in FIG. 1) after these have been made into the light emitting device 1.

Second Step

Figure 4B:
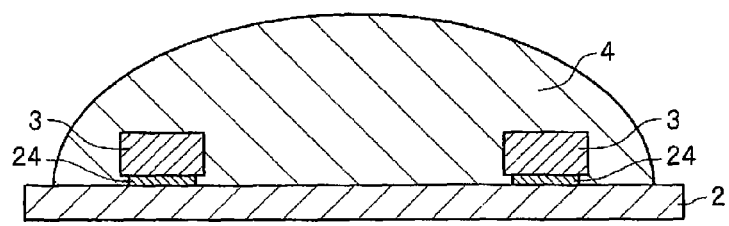
FIG. 4b is a diagram illustrating the step in a method for manufacturing the light emitting device according to Embodiment 1 of the invention.

Next, as shown in FIG. 4B, the light-transmissive member 4 is formed on the substrate 2 on which the light emitting element 3 are mounted, so as to cover the surface of the light emitting element 3 and the substrate 2.

As shown in FIGS. 4a to 4d and 5, in this embodiment, a plurality of substantially semiellipse spherical light-transmissive members 4 that cover two adjacent light emitting elements 3 are formed.

These light-transmissive members 4 are formed such that when the side face 11 on the opening 11a side is define to be the front and the side face 12 on the opposite side is define to be the rear after the light emitting device 1 has been produced, then the inner wall 55 of the reflecting layer 6 has a shape that continuously curves to the inside, so as to surround the rear (the side face 12 side), the top (the upper face 13 side), and the left and right sides (the side faces 52 and 53 sides) of the light emitting element 3 as shown in FIG. 1.

The light-transmissive members 4 can be formed, for example, by transfer molding, by compression molding, by potting a resin with high adhesion and forming it into a dome shape, by drawing with a resin dispensed from a dispenser, by mask printing, by a method in which a previously molded resin is cut and diced, or by a combination of these methods.

Third Step

Figure 4C:
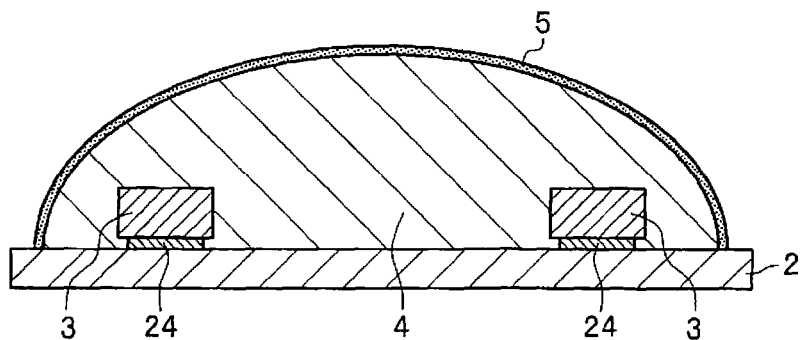
FIG. 4c is a diagram illustrating the step in a method for manufacturing the light emitting device according to Embodiment 1 of the invention.

Next, as shown in FIG. 4C, the phosphor layer 5 is formed over substantially the entire surface so as to cover the top of the light-transmissive member 4.

Examples of methods for forming the phosphor layer 5 include a method in which a resin, or a sol of an inorganic substance, or the like containing a phosphor is mixed with a solvent and then sprayed, a method in which a phosphor-containing sheet is attached, and the method described in the second step above, but it is preferable to use a method with which the entire phosphor layer 5 can be made thinner and/or the phosphor can be formed more densely.

This reduces variance in the emission color of the light emitting device 1.

Preferable examples of such a method include the above-mentioned spraying, and electrodeposition.

Electrodeposition can be performed in such a procedure as that an aluminum film is formed as an electrodeposition electrode by sputtering over the light-transmissive member 4, a phosphor is electrodeposited over this aluminum film, and then the aluminum film is oxidized to be rendered transparent, among other possible means.

Fourth Step

Figure 4D:
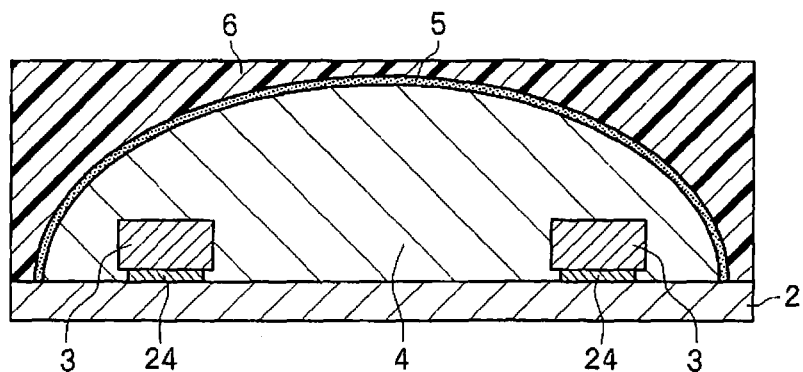
FIG. 4d is a diagram illustrating the step in a method for manufacturing the light emitting device according to Embodiment 1 of the invention.

Next, as shown in FIG. 4D, the reflecting layer 6 (serving as a reflecting member) is formed over the phosphor layer 5.

There are no particular restrictions on the formation method, but when a light reflecting resin is used, examples include transfer molding and compression molding.

Fifth Step

Figure 4E:
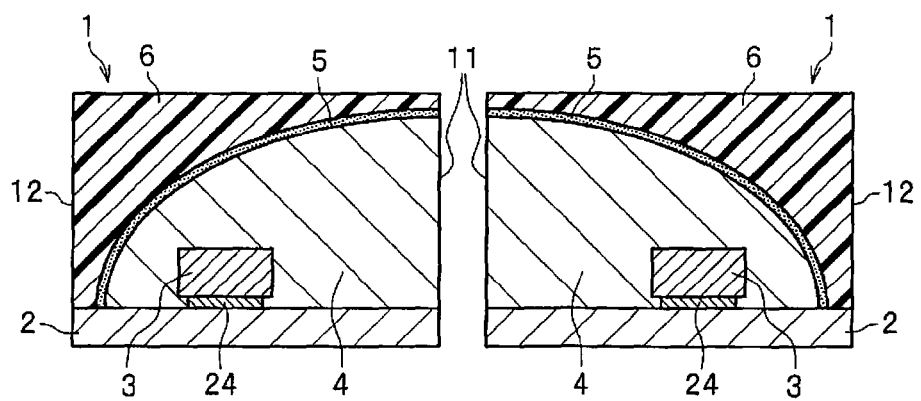
FIG. 4e is a diagram illustrating the step in a method for manufacturing the light emitting device according to Embodiment 1 of the invention.

Next, as shown in FIG. 4E, the product formed in FIG. 4D is separated or cut into units that will serve as a single light emitting device 1, that is, so as to include the substrate 2, the light-transmissive member 4, the phosphor layer 5, and the reflecting layer 6, thereby producing individual light emitting devices 1.

More specifically, the product is diced along the one-dot chain lines 15 shown in FIG. 5, that is, along the approximate center lines of the reflecting layers 6 between the light emitting elements 3 and the center lines of the light-transmissive members 4 that are substantially elliptical in plan view, which produces a plurality of individual light emitting devices 1.

In this embodiment, the cut faces of the light-transmissive members 4 become openings in the side faces 11 that are the light extraction faces of the light emitting devices 1.

Figure 6A:
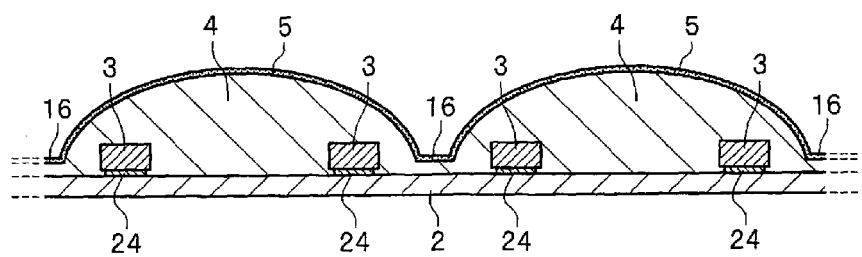
FIG. 6a is enlarged vertical cross section of when numerous light emitting devices have been formed on an aggregate substrate, illustrating the method for manufacturing the light emitting device according to Embodiment 1 of the invention.

Also, when the light-transmissive members 4 are formed on the aggregate substrate 2 by transfer molding, and the phosphor layer 5 is formed over the light-transmissive members 4 as in this embodiment, as shown in FIG. 6A, joint portions 16 are formed between areas adjacent light emitting elements 3 and will not be on the light extraction side (such as the portion that will become the rear or the side face of each light emitting device 1), in a state in which the light-transmissive members 4 and the phosphor layer 5 are provided on the aggregate substrate 2.

Figure 6B:
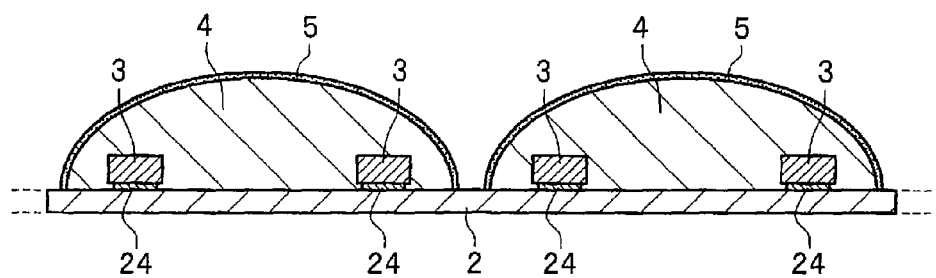
FIG. 6b is enlarged vertical cross section of when numerous light emitting devices have been formed on an aggregate substrate, illustrating the method for manufacturing the light emitting device according to Embodiment 1 of the invention.

In this case, the phosphor layer 5 can be formed in the step of FIG. 4C after the portion of the light-transmissive members 4 have been removed by dicing or the like (sixth step) as shown in FIG. 6B, after the second step in FIG. 4B and before the third step in FIG. 4C.

Figure 7:
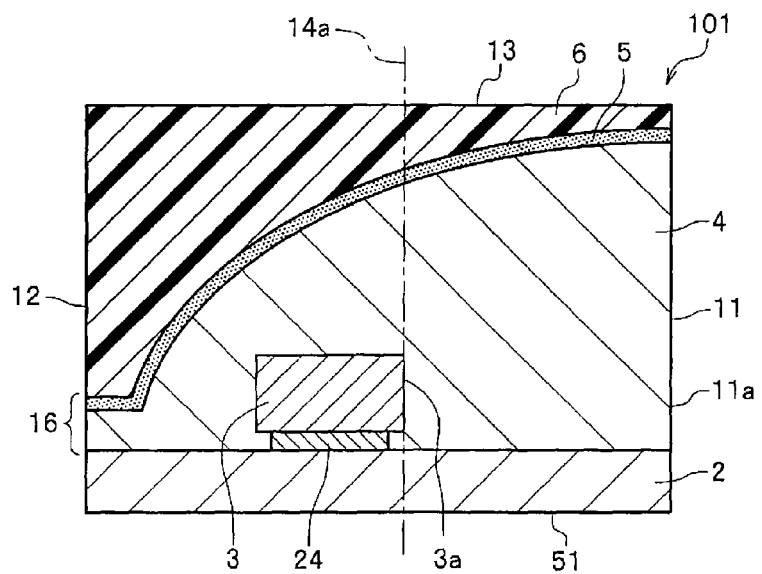
FIG. 7 is an enlarged vertical cross section of the light emitting device pertaining to a modification example of the light emitting device according to Embodiment 1 of the invention.

FIG. 7 is a detail vertical cross section of a light emitting device 101, which is the light emitting device in another embodiment.

With the light emitting device 101 in the embodiment shown in FIG. 1, which is manufactured through the above-mentioned steps up to the sixth step, the leakage of light from the light-transmissive joint portions 16 can be prevented with the configuration in FIG. 7, in which the manufacture does not involve the sixth step.

The rest of the configuration of the light emitting device 101 in FIG. 7 is similar to that of the light emitting device 1 in FIG. 1, the same numbering as in FIG. 1 is used, and explanation for the similar parts are abbreviated.

The light emitting device 101 shown in FIG. 7 can be manufactured less expensively by batch molding.

With the manufacturing method in this embodiment, when the face of the light emitting device 1 on the substrate 2 side is define to be the bottom face 51, the side face 11 of the light emitting device 1 will be the light extraction side of the light emitting element 3 (see FIG. 4E).

Also, in the step in FIG. 4C, when this light extraction side (the side face 11) is define to be the front and the opposite side (the side face 12) is define to be the rear, the phosphor layer 5 and the reflecting layer 6 are provided on the left and right sides, to the rear, and to the front of the light emitting element 3.

Furthermore, in the step in FIG. 4A, the light emitting elements 3 is mounted in a position that will be further to the rear than the center of the individual substrate 2 in the longitudinal direction (the one-dot chain line 14 in FIG. 1).

With the light emitting device 1 manufactured by above process, part of blue light that emitted from the light emitting element 3 will be converted by the phosphor layer 5 into yellow light, and then reflected by the reflecting layer 6 to the side of the light-transmissive member 4.

The blue light and yellow light will separately be extracted from the opening in the side face 11, and partially color-mixed white light will be extracted from the opening in the side face 11.

With the light emitting device 1 and its manufacturing method described above, since the light emitting element 3 is flip-chip mounted on the substrate 2, bonding wire or the like can be omitted, so the light emitting device 1 can be made slimmer.

Also, since the light extraction face is the side face 11 of the light emitting device 1, a wide light emitting element 3 can be mounted even though the light extraction face is small.

Thus, a wider light emitting element 3 can be mounted to increase the light output.

Thus, with the light emitting device 1 in Embodiment 1, a slimmer light emitting device 1 can be obtained and the light output can be increased.

Also, with the light emitting device 1 in Embodiment 1, since the light emitting element 3 and the phosphor layer 5 are separated so that they are not in contact, there is less return light from the phosphor layer 5 to the light emitting element 3, and the light extraction efficiency of the light emitting device 1 can be increased.

Furthermore, since part of the light emitted from the light emitting element 3 is extracted without being incident on the phosphor layer 5, blue light can be extracted efficiently, and the light extraction efficiency of the light emitting device 1 can be increased.

Moreover, with the light emitting device 1 in Embodiment 1, since the light incident on the phosphor layer 5 is reflected by the reflecting layer 6, there is less multiple reflection within the phosphor layer 5.

Accordingly, the absorption of light within the phosphor layer 5 can be reduced.

Also, since the light incident on the phosphor layer 5 is reflected by the reflecting layer 6, variance in the color of the light from the light emitting device 1 caused by variance in the thickness of the phosphor layer 5 can also be reduced.

That is, as long as the phosphor layer 5 has at least a certain thickness, the color of the light obtained from the phosphor layer 5 will be saturated (that is, just light that contains substantially no light of the emission wavelength of the light emitting element, and whose wavelength has been converted by the phosphor can be obtained), so the color of the resulting white light obtained from the light emitting device 1 can be made consistent, and the color yield of the product can be raised.

The embodiment of the above can be modified in various ways.

Figure 8:
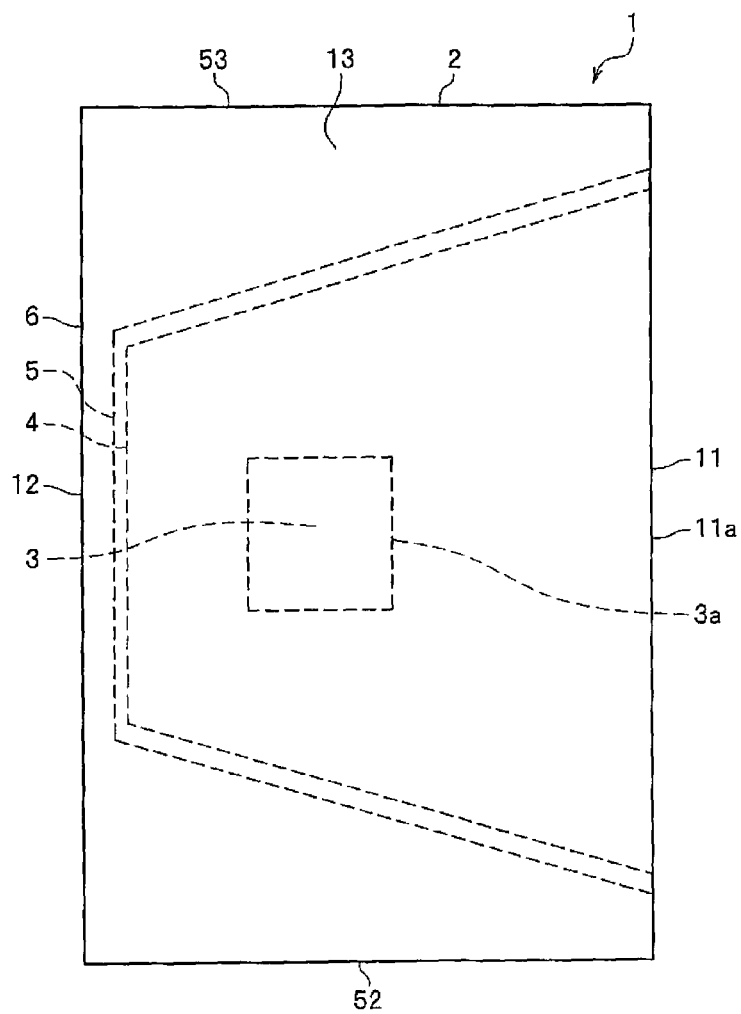
FIG. 8 is an enlarged plan view of the light emitting device according to another modification example of Embodiment 1 of the invention.

FIG. 8 is a detail plan view of the light emitting device 1 according to modification of Embodiment 1.

As in the example in FIG. 8, the outer shape of the light-transmittive member 4 and the phosphor layer 5 may be angular, such that the left and right sides and the rear side of the light emitting device 1 are substantially straight lines.

Also, a reflecting layer that serves as a second reflecting member (hereinafter referred to as the "second reflecting layer") may be formed between the phosphor layer 5 and the reflecting layer 6.

The reflecting layer can be formed by following step, for example, in between the step in FIG. 4C and the step in FIG. 4D, a metal film with high optical reflectivity, such as silver, aluminum, platinum, or rhodium, or a DBR (Distributed Bragg Reflector) mirror may be formed over the phosphor layer 5

When a reflecting layer that serves as a second reflecting layer is thus formed, the reflecting layer 6 need not be formed.

This point is also applicable to Embodiments 2 and other embodiments (described below).

Embodiment 2

Figure 9:
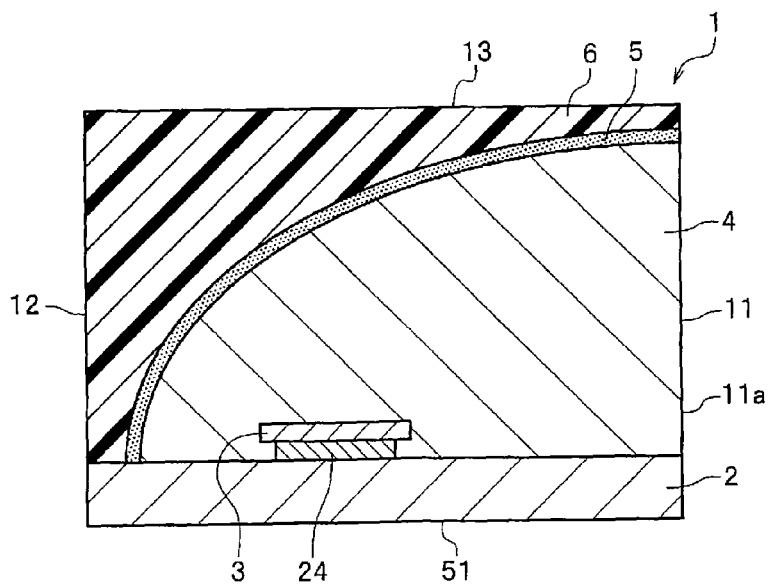
FIG. 9 is a detail vertical cross section of the light emitting device according to Embodiment 2 of the invention.

FIG. 9 is a detail vertical cross section of the light emitting device 1 pertaining to Embodiment 2 of the present invention.

In FIG. 9, those members shared with Embodiment 1 are numbered the same and their detail description will be abbreviated.

The manufacturing method, unless otherwise specified, is also the same as in Embodiment 1.

The difference in the structure and manufacturing method of the light emitting device 1 in this embodiment from those of the light emitting device 1 in Embodiment 1 is that the substrate 32, which is the substrate for growing the semiconductor layer as the light emitting element 3 that is flip-chip mounted on the substrate 2, is removed.

As flip-chip mounting is performed just as in Embodiment 1, and the growth substrate is separated and removed from the light emitting element 3 by laser liftoff or another such method, the light emitting element 3 can be even slimmer than in Embodiment 1.

Thus separating the growth substrate and making the uppermost face of the light emitting element 3 the semiconductor layer affords an even slimmer light emitting device 1.

Also, since the light emitting element 3 has no substrate 32, light extraction efficiency of the light emitting element 3 can be improved, thus the light extraction efficiency of the light emitting device 1 can be raised.

Embodiment 3

Figure 10:
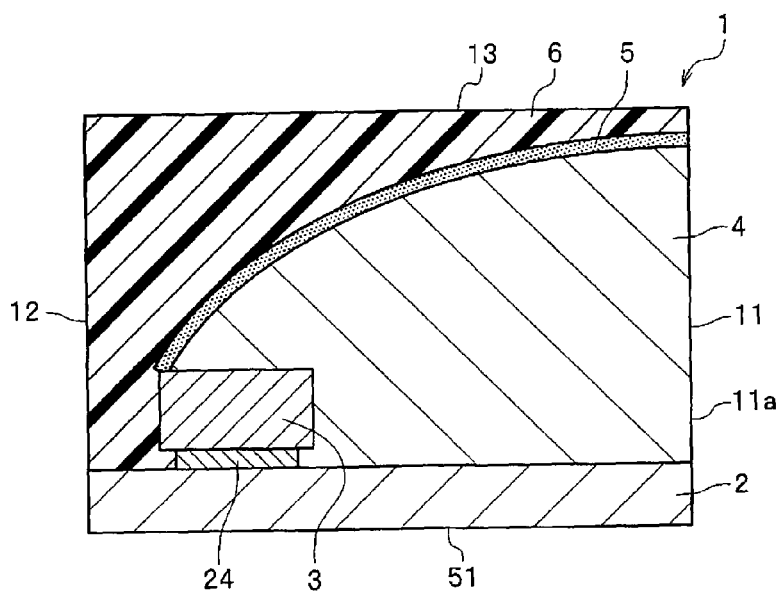
FIG. 10 is an enlarged vertical cross section of the light emitting device according to Embodiment 3 of the invention.

FIG. 10 is a detail vertical cross section of the light emitting device 1 pertaining to Embodiment 3 of the present invention.

In FIG. 10, those components shared with Embodiment 1 are numbered the same and their detail description will be abbreviated again.

The manufacturing method, unless otherwise specified, is also similar to that in Embodiment 1.

The difference in the structure and manufacturing method of the light emitting device 1 in this embodiment from those of the light emitting device 1 in Embodiment 1 is that the light-transmissive member 4 and the phosphor layer 5 are not formed on a rear face 3b of the light emitting element 3 side which is on the opposite side from an opening 11 (light emitting face), and that this rear face 3b is in direct contact with the reflecting layer 6.

Such configuration can be obtained by following method, that is, in the steps in FIGS. 4b and 4c, the light-transmissive member 4 and the phosphor layer 5 are not formed on the rear face 3b side of the light emitting element 3, and in the step in FIG. 4D, the reflecting layer 6 is formed so that the rear face 3b will be in direct contact with the reflecting layer 6.

This reflecting layer 6 can be formed, for example, from a light reflecting material, such as by potting a white resin, at the rear face 3b of the light emitting element 3.

Consequently, light outputted from the light emitting element 3 on the opposite side from the light extraction side (the side face 11 side) can be efficiently reflected by the reflecting layer 6.

Also, the material formed in contact with the rear face 3b of the light emitting element 3 may be an underfill material mentioned above rather than the reflecting layer 6.

Embodiment 4

Figure 11:
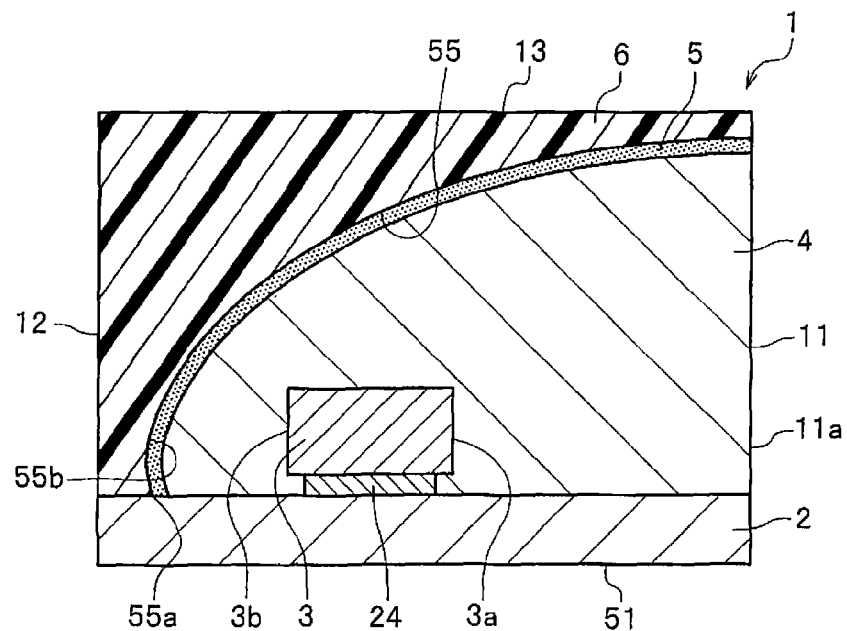
FIG. 11 is an enlarged vertical cross section of the light emitting device according to Embodiment 4 of the invention.

FIG. 11 is a detail vertical cross section of the light emitting device 1 pertaining to Embodiment 4 of the present invention.

In FIG. 11, those members shared with Embodiment 1 are numbered the same and their detail description will be abbreviated.

The manufacturing method, unless otherwise specified, is also similar to that in Embodiment 1.

The difference in the structure and manufacturing method of the light emitting device 1 in this embodiment from those of the light emitting device 1 in Embodiment 1 is that, when the face 3a on the opening 11a side of the light emitting element 3 is define to be the front and the face 3b on the opposite side is define to be the rear, the inner wall 55 of the reflecting layer 6 on the rear face 3b side has a concave shape as viewed from the light emitting element 3 side, that is, the portion 55a of the inner wall 55 that touches the substrate 2 is rounded so as to protrude further to the front side than the portion 55b above.

To obtain such a configuration, part of the phosphor layer 5 and the reflecting layer 6 on the rear face 3b can be formed prior to the formation of the light-transmissive member 4 in FIG. 4B, so that the phosphor layer 5 on the rear face 3b side of the light emitting element 3 will have this shape.

This configuration allows the light emitted on the opposite side from the light extraction side (the side face 11 side) of the light emitting device 1 to be effectively reflected by the reflecting layer 6 with this shape.

Embodiment 5

Figure 12:
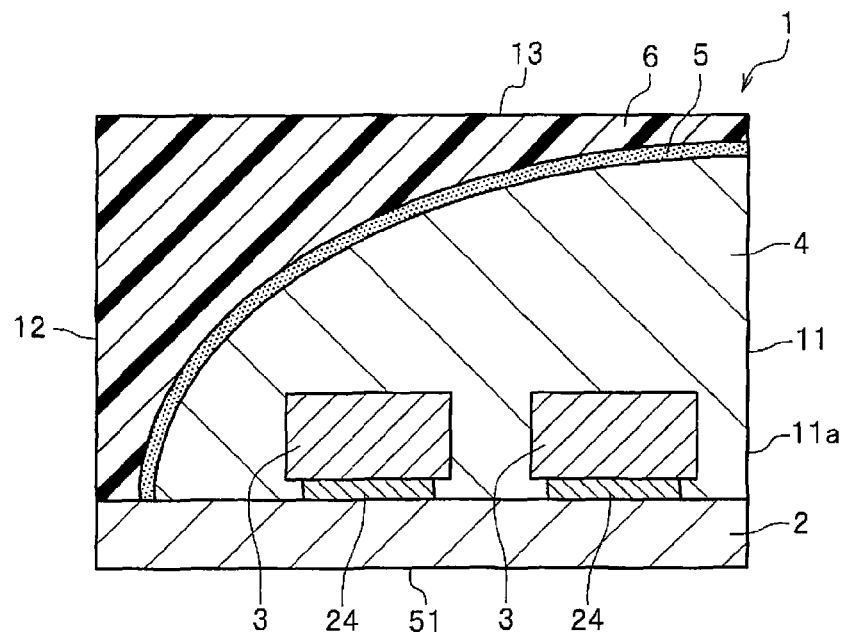
FIG. 12 is n enlarged vertical cross section of the light emitting device according to Embodiment 5 of the invention.

FIG. 12 is a detail vertical cross section of the light emitting device 1 pertaining to Embodiment 5 of the present invention.

In FIG. 12, those members shared with Embodiment 1 are numbered the same and their detail description will be abbreviated again. The manufacturing method, unless otherwise specified, is also similar to that in Embodiment 1.

The difference in the structure and manufacturing method of the light emitting device 1 in this embodiment from those of the light emitting device 1 in Embodiment 1 is that a plurality of (two in the example in FIG. 12) light emitting elements 3 are mounted on a single light emitting device 1.

This raises the light output of the light emitting device 1.

Embodiment 6

Figure 13:
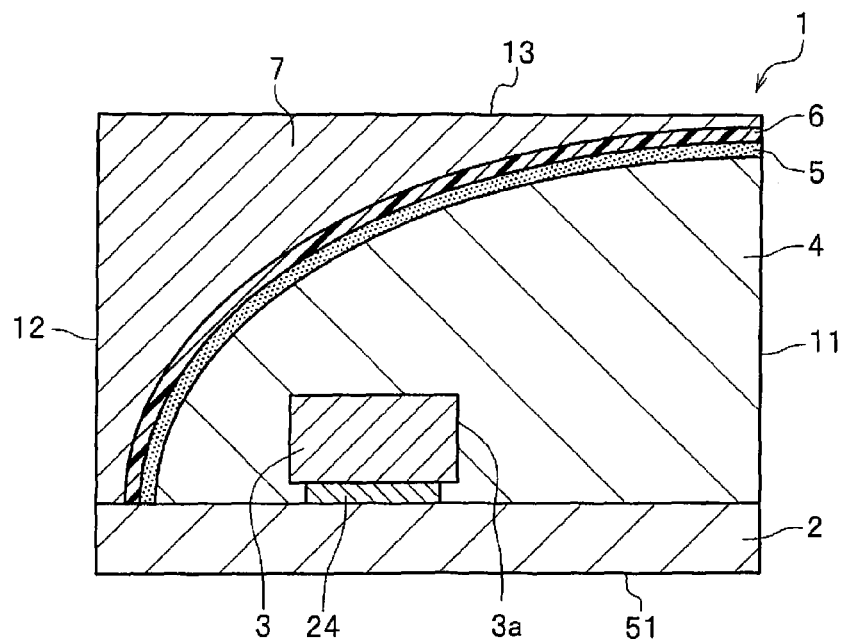
FIG. 13 is an enlarged vertical cross section of the light emitting device according to Embodiment 6 of the invention.

FIG. 13 is a detail vertical cross section of the light emitting device 1 pertaining to Embodiment 6 of the present invention.

In FIG. 13, those components shared with Embodiment 1 are numbered the same and their detail description will be abbreviated.

The manufacturing method, unless otherwise specified, is also similar to that in Embodiment 1.

The difference in the structure and manufacturing method of the light emitting device 1 in this embodiment from those of the light emitting device 1 in Embodiment 1 is that the reflecting layer 6 is in the form of a thin film, and a package member 7 is provided that covers the reflecting layer 6 and serves as the outer face of the light emitting device 1.

When the reflecting layer 6 is provided between the package member 7 and the light-transmissive member 4 as in this embodiment, the material of the package member 7 is not limited to one having high optical reflectivity, and can be selected from a wide variety of materials.

For instance, an epoxy resin, PPA, or another such material that has black color and is relatively inexpensive can be used preferably.

There are no particular restrictions on the method for forming the package member 7, and it can be formed by the method similar to that of the reflecting layer 6 serving as the above-mentioned first reflecting member.

In this embodiment, the reflecting layer 6 can be formed using the similar material and manufacturing method as the above-mentioned second reflecting layer or the reflecting layer 6 serving as the first reflecting member in Embodiment 1.

It should go without saying that the embodiments described above do not limit the present invention.

That is, it is to be understood that although the present invention has been described with regard to preferred embodiments thereof, various other embodiments and variants may occur to those skilled in the art, which are within the scope and spirit of the invention, and such other embodiments and variants are intended to be covered by the following claims.

For example, the light emitting device 1 that is an embodiment of the present invention may be such that the light-transmissive members 4 of the joint portions 16 in the light emitting device 1 in FIG. 7 may be removed, and the joint portions 16 become the substrate 2, the phosphor layer 5, and the reflecting layer 6 from below.

INDUSTRIAL APPLICABILITY

The light emitting device according to the present disclosure can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

What is claimed is:

1. A light emitting device comprising:
   a substrate;
   a light emitting element flip-chip mounted on the substrate;
   a phosphor-containing member provided at least above the light emitting element and separated from the light emitting element;
   a first reflecting member configured to cover the phosphor-containing member, and
   an opening in at least one of side faces of the light emitting device, the opening extracting light emitted from the light emitting element and light whose wavelength is converted by the phosphor-containing member.

2. The light emitting device according to claim 1, wherein the phosphor-containing member surrounds the light emitting element.

3. The light emitting device according to claim 1, wherein when the side face with the opening is defined to be the front and the side face on the opposite side is defined to be the rear, the first reflecting member has an inner wall with a shape that continuously curves inwardly so as to surround the rear, top, left and right sides of the light emitting element, and
   the light emitting element is provided closer to the rear than a center of the substrate in the longitudinal direction.

4. The light emitting device according to claim 1, wherein the light emitting element is in contact with the first reflecting member on a face on opposite to the opening.

5. The light emitting device according to claim 1, wherein an inner wall of the first reflecting member is bent so as to have a concave shape as viewed from the light emitting element.

6. The light emitting device according to claim 1, wherein a plurality of light emitting elements are mounted on the substrate.

7. The light emitting device according to claim 1, wherein an uppermost face of the light emitting element is a semiconductor layer.

8. The light emitting device according to claim 1, further comprising
   a light-transmissive member containing substantially no phosphor,
   the light emitting element is covered by the light-transmissive member, and
   the phosphor-containing member is provided over the light-transmissive member.

9. The light emitting device according to claim 8,
   both of the light-transmissive member and the phosphor-containing member are exposed at the opening.

10. The light emitting device according to claim 1, further comprising
    a second reflecting member, and
    the second reflecting member is provided between the phosphor-containing member and the first reflecting member.

11. The light emitting device according to claim 10,
    the light emitting element is in contact with the second reflecting member on a face on an opposite to the opening.

12. A method for manufacturing a light emitting device, the method comprising
    mounting a light emitting element onto a substrate in a flip-chip manner,
    forming a phosphor-containing member at least above the light emitting element, the phosphor-containing member being separate from the light emitting element, forming a first reflecting member that is configured to covers the phosphor-containing member, and forming, on at least one side face of the light emitting device, an opening for extracting light whose wavelength is converted by the phosphor-containing member and light emitted from the light emitting element.

13. The method for manufacturing a light emitting device of claim 12, wherein the mounting of the light emitting element includes mounting a plurality of light emitting elements onto an aggregate substrate.

14. The method for manufacturing a light emitting device of claim 12, further comprising forming a light-transmissive member after the mounting of the light emitting element onto the substrate and before the formation of the phosphor-containing member.

15. The method for manufacturing a light emitting device of claim 14, wherein the formation of the light-transmissive member includes forming the light-transmissive member that covers the plurality of light emitting elements; and the formation of the phosphor-containing member includes forming the phosphor-containing member that covers the light-transmissive member.

16. The method for manufacturing a light emitting device of claim 15, wherein the formation of the opening includes cutting the aggregate substrate, the light-transmissive member, and the phosphor-containing member.

* * * * *